United States Patent
Schwartz et al.

(10) Patent No.: US 6,350,690 B1
(45) Date of Patent: Feb. 26, 2002

(54) PROCESS FOR ACHIEVING FULL GLOBAL PLANARIZATION DURING CMP OF DAMASCENE SEMICONDUCTOR STRUCTURES

(75) Inventors: Gary Paul Schwartz, Orlando, FL (US); Ramachandran Muralidhar, Travis; Stephen Hymes, Austin, both of TX (US)

(73) Assignees: Advanced Micro Devices, Inc., Sunnyvale, CA (US); Agere Systems Guardian Corp., Orlando, FL (US); Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/288,646

(22) Filed: Apr. 9, 1999

(51) Int. Cl.$^7$ .............................................. H01L 21/461
(52) U.S. Cl. ...................... 438/690; 438/691; 438/692; 438/693
(58) Field of Search ................................. 438/690, 691, 438/692, 693

(56) References Cited

U.S. PATENT DOCUMENTS

| | | | | |
|---|---|---|---|---|
| 5,403,779 A | * | 4/1995 | Joshi et al. | ............... 437/190 |
| 5,585,673 A | * | 12/1996 | Joshi et al. | ............... 257/751 |
| 5,830,797 A | * | 11/1998 | Cleeves | ................... 438/296 |

* cited by examiner

Primary Examiner—Robert Kunemund
Assistant Examiner—Charlotte A. Brown (57) ABSTRACT

Described is a process for using chemical-mechanical planarization in the manufacture of Damascene structures that substantially reduces unwanted topography. The process is implemented in two stages to separate bulk metal removal and interface clearing. In stage 1 a top metal layer is planarized both globally and locally by CMP removal at a high rate of the preponderance of overlying metal, without penetrating to dielectric or barrier materials and with a minimum of CMP-generated global topography. For stage 2, the slurry is formulated with a 1:1:1 removal rate selectivity as to the metal/barrier/dielectric materials, the object being to preserve the highly flat topography achieved in stage 1.

8 Claims, 8 Drawing Sheets

| STEP 1 |
|---|
| CMP REMOVAL OF A PREPONDERANCE OF METALLIC TOP LAYER ON A WAFER TO ELIMINATE GLOBAL AND LOCAL TOPOLOGY AND FORM PLANAR SURFACE IN THE METALLIC TOP LAYER CLOSELY ADJACENT TO BARRIER LAYER |

| STEP 2 |
|---|
| CMP REMOVAL OF FURTHER METAL ON THE MAFER AND OF BARRIER AND DIELECTRIC MATERIAL, USING A SLURRY HAVING SUBSTANTIALLY A 1:1:1 REMOVAL RATE SELECTIVITY AS TO METAL/BARRIER/DIELECTRIC MATERIAL OF THE WAFER |

FIG. 9

PROCESS FOR ACHIEVING FULL GLOBAL PLANARIZATION DURING CMP OF DAMASCENE SEMICONDUCTOR STRUCTURES

FIELD OF THE INVENTION

This invention relates to the realization of planar layers in semiconductor wafer fabrication; and more particularly to a process for implementing chemical-mechanical planarization ("CMP") in the manufacture of Damascene structures to achieve both global and local planarization without generating excessive unwanted topography.

BACKGROUND OF THE INVENTION

Integrated circuits are comprised of arrays of interconnected devices and components such as transistors, resistors, diodes and capacitors formed as patterns on a series of vertically stacked films on a substrate. In fabricating integrated circuits, it is critical that the film layers on each substrate have "topographical planarity": that is, the surface features of a given film layer must fall in a common plane, and the stacked planes must be parallel. A lack of planarity causes problems in photolithography and etch steps as well as other problems. The requirement of maintaining planarity becomes increasingly critical with each additional conductive or dielectric layer. At several points in the fabrication process, therefore, the wafer is "planarized" to minimize any topography.

As used herein, the term "topography" refers to anomolies in the surfaces of material layers within the wafer, which give rise to lack of surface planarity. Certain topographic conditions are "global", in that the anomaly exists across most or all of the surface layer. Other topographic conditions are "local" in that the anomalies show up in one or many discrete areas along the layer.

In the CMP process, a wafer of semiconductor material is held on a rotating polishing platen while a slurry-wetted polishing pad is rotated against the material surface. The slurry is a mixture of either a basic or an acidic solution to which is added abrading material such as alumina or silica particles. The liquid portion of the slurry chemically reacts with the surface of the semiconductor material to remove, loosen or modify the surface material. Concurrently, as the polishing platen and pad rotate, the particles suspended in the slurry mechanically remove surface material. Planarization processes can be applied to conductive, semiconductive or dielectric insulating layers.

For several reasons, there is increasing reliance on CMP technology. For example, an important application of CMP technology is to the Damascene process, which produces conductive interconnects and other details that are directly defined without using a reactive ion etch process. The Damascene process has the potential to fabricate submicron geometry interconnects. Further, copper is emerging as the preferred metal for back end-of-line metallization for integrated circuits. CMP is the most feasible method by which the copper can be patterned to the required "global planarity" for these wafers.

Achieving topological planarity when using the CMP process depends in large part on process "selectivity", or how well the polishing performance can be engineered to remove high areas on the substrate at a greater rate than it removes low areas. The metrics governing the polish performance of a metal CMP process are designed to minimize the topographic conditions of dishing, erosion and line thinning of the defined structures. Dishing is more relevant at higher metal layers where wider metal lines typically occur. Erosion appears to be the primary factor in polishing performance at lower levels of metallization where higher pattern density structures are defined. These topographic conditions are further described hereinafter.

In current CMP treatment of copper layers, typically a single-slurry, single-step polish process is employed. An oxide buff polish may be included as a second step. The slurry is formulated with a low copper:barrier selectivity approaching 1:1; and as high a copper:dielectric selectivity as possible. The process does not, however, satisfactorily reduce the generation of topography. The consequences include overall line thinning which adversely affects circuit performance through resistance increases of the conducting line, which in turn causes increased RC delay. Topography also can cause metal stringers at subsequent levels, cause depth-of-focus violations during subsequent lithography, cause etch margin errors due to dielectric thickness variations for spun-on dielectrics, and necessitate increased overpolish requirements. All of these problems drive up the cost of fabrication and decrease the line yields.

SUMMARY OF THE INVENTION

The invention is a metal CMP process which minimizes topography by partitioning of the copper polish step into a 2-stage process for separate bulk metal removal and interface clearing. First, in stage 1 the initial metallic topography is planarized both globally and locally by CMP removal of a preponderance of overlying metal without penetrating to dielectric or barrier materials. The focus is to complete stage 1 with a minimum of CMP-generated global topography, thus to produce a metal surface as flat as possible. There is no issue in stage 1 of controlling the barrier:dielectric removal rate, since stage 1 ends prior to exposing the barrier. Then in stage 2, using a slurry having a 1:1:1 removal rate selectivity as to the metal/barrier/dielectric materials, further removal proceeds with attention to good polishing uniformity, the object being to preserve the optimally flat topography achieved in stage 1. Polishing proceeds in stage 2 until a selected plane containing all three materials is reached, for which in accordance with the invention the high degree of stage 1 planarity has been maintained.

In a further embodiment, stage I may be segmented into a first phase in which a high rate of CMP is maintained, and a second phase where the CMP rate is reduced to allow a more controlled removal of material.

DETAILED DESCRIPTION OF AN ILLUSTRATIVE EMBODIMENT

In the descriptions to follow, the term "dielectric" refers to either bulk dielectric material if a single layer dielectric is used; or alternatively, to the capping layer if a bi-layer stack is used as, for example, when low-k dielectrics are employed. The term "low-k" as used herein is exemplified by dielectric material of high carbon content, typically that of organic polymeric materials such as: polytetrafluoroethylene (k=1.9); benzocyclobutene (k=2.6); polyimide (k=2.8); and polyaryl ether (k=2.9).

Figure 1:
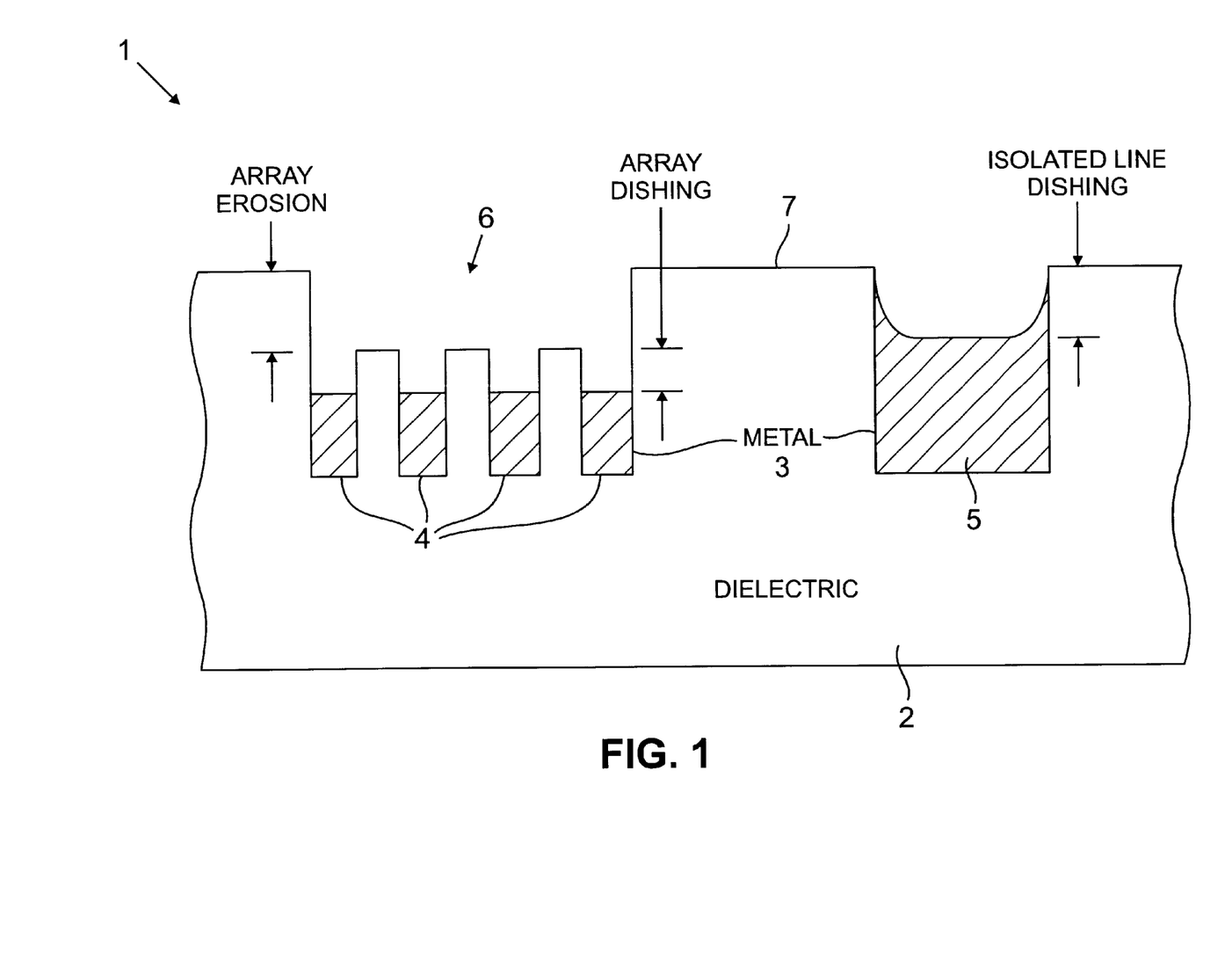
FIG. 1 is a schematic cross-sectional diagram of a semiconductor wafer illustrating several types of topography features, which are local in nature.

FIG. 1 illustrates conditions of local topographies generated during CMP, which are to be avoided. The semiconductor wafer, denoted 10, consists of wafer substrate 1 with dielectric layer 2 and metallized regions 3 including arrays 4 and a wide line 5. The wafer 10 and the regions shown have been subjected to a CMP process in which the planarization has generated imperfections, or "topography". Array erosion is evident between the top surface 7 of wafer 10 and the sunken top surfaces 6 of dielectric that extends above the arrays 4. Array dishing is evident in the disparity between the top of the metal arrays 4 and the surfaces 6. Isolated line dishing is seen in the disparity between the top surface 7 and the top of metallization 5. These types of topographies and their causation are noted elsewhere in this specification. By way of the following two examples, a strategy for essentially avoiding these topographies is described.

Figure 2:
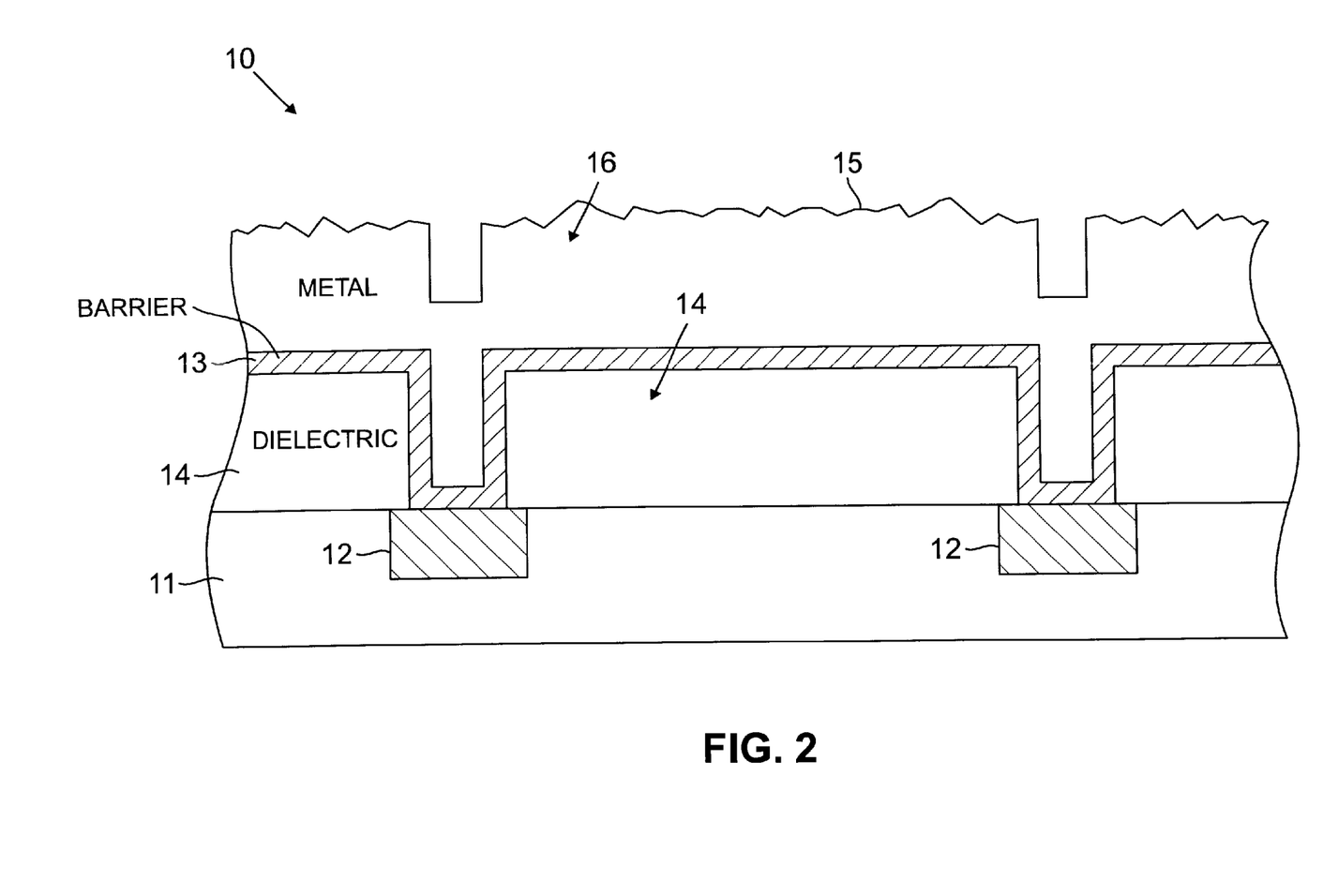
FIG. 2 is a schematic diagram of an exemplary single layer dielectric semiconductor wafer before commencement of the 2-stage polishing of the invention and showing some initial topography.

The invention is first described in an application to planarization of a single layer dielectric semiconductor wafer 10, which is shown in FIG. 2 prior to commencement of polishing. Wafer 10 consists of a substrate 1 with a layer 11 comprised of dielectric material. Layer 11 may alternatively be the silicon substrate 1 of the wafer 10. Contact pads 12 are formed in layer 11. A barrier layer 13 is formed on dielectric 14 to keep the metal from penetrating into and contaminating the dielectric 14. A metallic layer 16 is formed atop barrier layer 13, its top surface 15 showing the initial irregular topography resulting from the forming process.

Metal layer 16 may consist of copper, tungsten, aluminum, or suitable equivalent material. By way of example, barrier 13 may consist of tantalum, tantalum nitride, tantalum silicon nitride, titanium /titanium nitride, tungsten nitride, or tungsten silicon nitride. Dielectric layer 14 may consist of TEOS (TetraEthylOrthoSilicate), BPSG (BoroPhosphoSilicate Glass), PSG (PhosphoSilicate Glass) or SOG (Spin on Glass). Examples of low-k dielectric materials for forming dielectric layers include organic polymeric materials such as: polytetrafluoroethylene (k=1.9); benzocyclobutene (k=2.6); polyimide (k=2.8); and polyaryl ether (k=2.9). Contact pads 12 are formed with copper, tungsten or aluminum; or alternatively are formed with materials such as titanium silicide, cobalt silicide, nickel silicide, or heavily doped polysilicon depending on whether layer 11 is a dielectric material or is the silicon substrate. Processes for fabricating the particular layers of wafer 10 are well known in the art. It is important, however, to apply the metallic layer 16 so that initially its top surface 15 is as uniform as possible.

Figure 8:
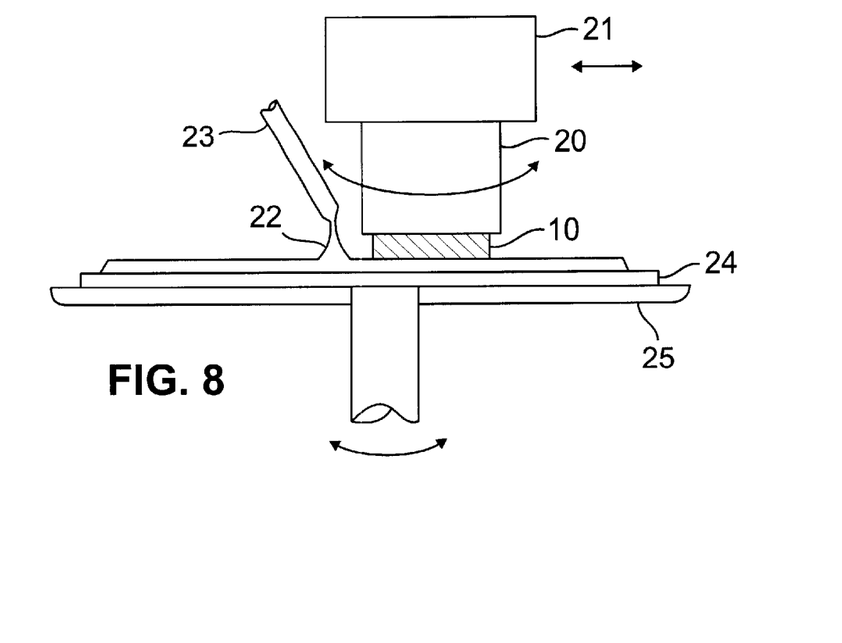
FIG. 8 is a schematic diagram of polishing apparatus used in CMP processes.
Figure 9:
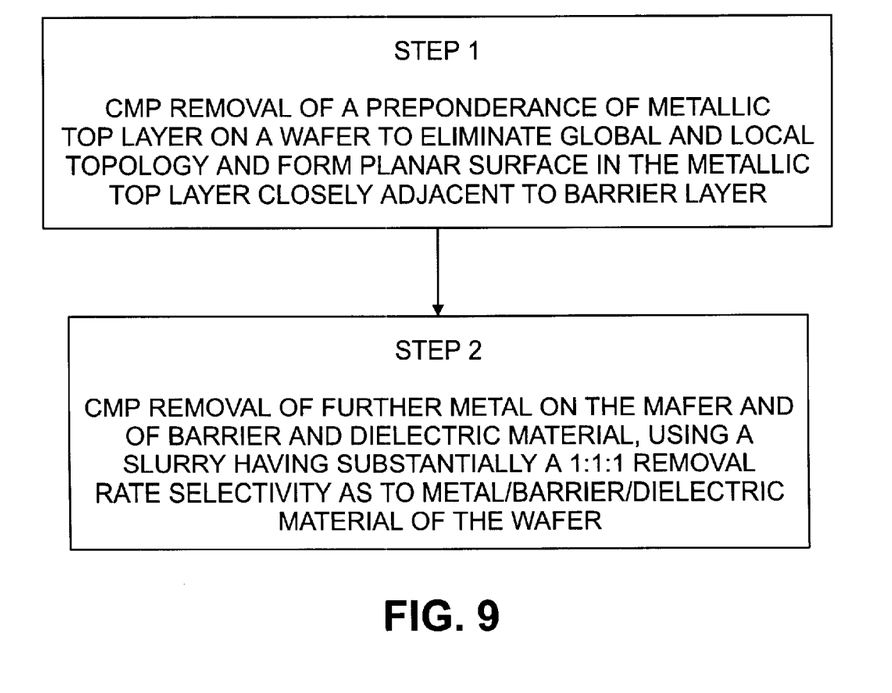
FIG. 9 is a flow chart listing the basic process steps embodying the invention.

Polishing apparatus suitable for practicing the process steps is exemplified in FIG. 8. A semiconductor wafer 10 is affixed to a rotating head 20 mounted in a laterally movable carrier 21. A slurry 22 is applied by a nozzle 23 onto polishing pad 24 which is adhered to a rotating platen 25. Platen 25 and head 20 are rotated, and pressure is applied to head 20 to force the mechanical removal of material by abrasion of the slurry on the wafer surface. FIG. 8 is exemplary; manufacturers of CMP polishing apparatus offer a range of commercial polishing equipments, which may be adapted for use with the invention.

EXAMPLE 1

Referring to FIG. 2, stage 1 of the process carries out a bulk metal removal step, in which 80–90% of the metal film is removed. The target removal rate may be set to a value within a wide range, typically 4,000 to 10,000 Angstroms per minute. Stage 1 minimizes both the local and global topography of the initial pre-polish metal film and assures that after bulk metal removal the resulting metal surface is as flat as possible. The slurry used in stage 1 advantageously contains alumina as an abrasive mixed with various proprietary additives such as oxidizers, surfactants, corrosion inhibitors, suspension agents and viscosity modifiers. Alumina-based slurries are typically employed in conjunction with "hard" polyurethane pads having a Shore hardness in the range of 50–70. On completion of stage 1 polishing, the wafer 10 has the geometry exemplified in FIG. 3. During stage 1 polishing, high platen speed and low downforce are usually preferred to ensure high metal film removal rate and efficient planarization. The slurry selected for stage 1 is not required to have constraints on the relative removal rates of the metal film, the barrier, and the dielectric.

Figure 3:
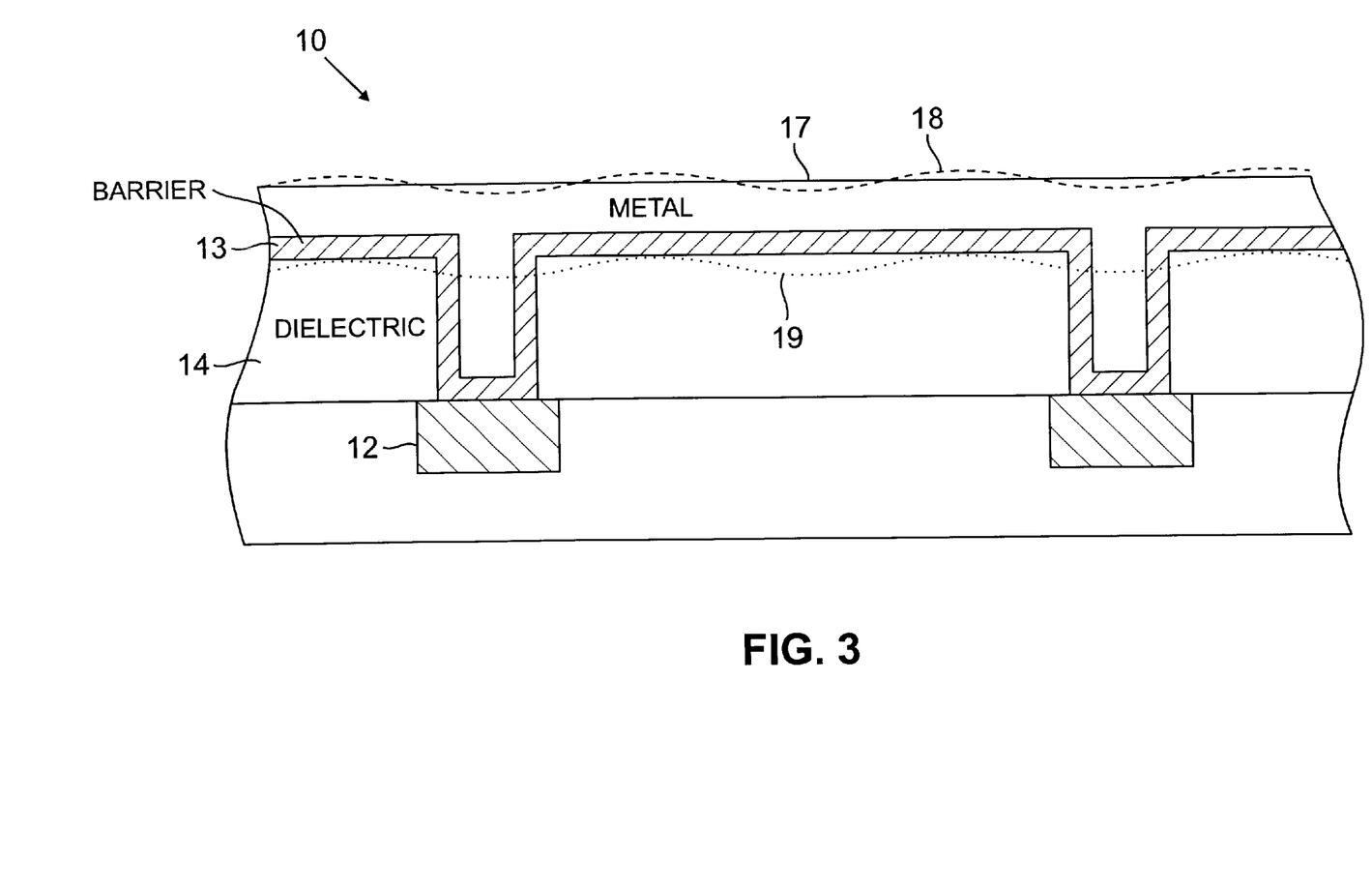
FIG. 3 is a schematic diagram of the wafer of FIG. 2 following application of stage 1 polishing.

Ideally a fully flat metallic surface denoted by the surface 17 in FIG. 3 is achieved in stage 1; but in practice some amount of global topology may sometimes be formed despite avoidance efforts. The dashed line 18 in FIG. 3 represents in exaggeration a global non-planar undulating metallic surface topography. Stage 2 of the present invention provides a way to preserve the degree of flatness achieved in stage 1, which does not exacerbate topography such as the surface represented by dashed line 18.

Figure 4:
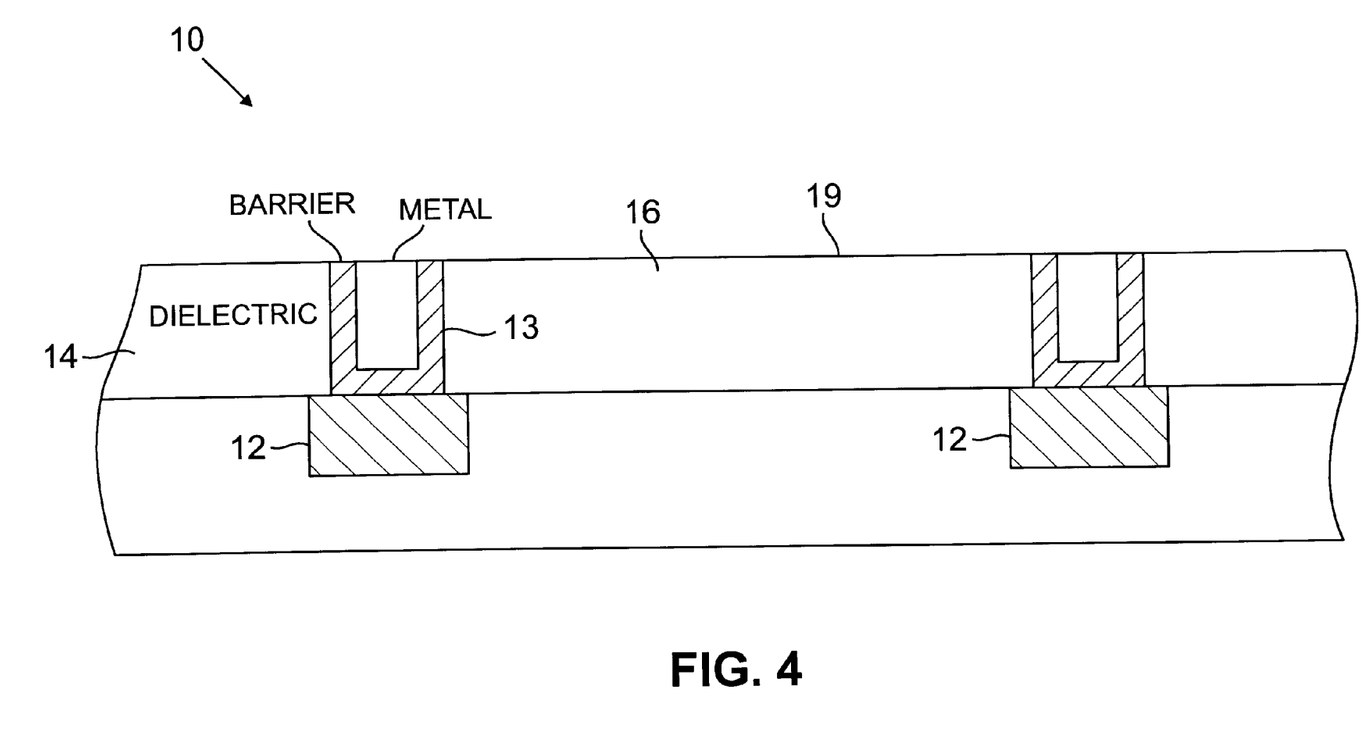
FIG. 4 is a schematic diagram of the wafer of FIG. 3 following application of stage 2 polishing.

In stage 2 the wafer is subjected to a clearing polish which applies a second set of consumables. Either a hard or a soft polishing pad may be used in stage 2 since in stage 1 the wafer has already been globally and locally planarized. The polishing conditions for this step typically emphasize low platen speeds and low downforce. A slurry is applied which removes metal, barrier and dielectric at removal rate ratios of substantially 1:1:1. That is, whatever removal rate is selected for one of the dissimilar materials, the slurry will remove the other two materials at the same rate. A general slurry composition for stage 2 consists of a silica abrasive, oxidizer, and additional additives including suspension agents and surfactants. A target removal rate for stage 2 is from 1,000 to 3,000 Angstroms per minute. The CMP action removes barrier 13 material at the same rate as metal 16. Toward the end of stage 2 in accordance with the invention, when the polishing action reaches dielectric 14, the rate of removal of dielectric 14 is the same as the metal and barrier removal rates. The dotted line 19 in FIG. 3 essentially replicates the contour of dashed line 18, and represents the extent of final CMP material removal on completion of stage 2 for the wafer shown. Importantly, the highest point in the undulation of dashed line 18 is taken down to barely "clip" the dielectric 14. The final geometry of wafer 10 in the case of an ideally uniform metal removal in stage 1 and exact achievement of the 1:1:1 removal rate ratios of stage 2 is a planarized surface 19a as shown in FIG. 4. In reality, surface 19a will exhibit no greater flatness than that achieved in stage 1 for line 18 in FIG. 3.

Persons skilled in the art will recognize that care must be taken in achieving global and local planarity in the metal remaining following the rough stage 1 polish step. For example, if as a result of stage 2 polishing any thinning of dielectric layer 14 occurs, the thinning may be compensated for by specifying an initial dielectric thickness which exceeds the final result by the amount targeted for loss in stage 2 of the polishing.

EXAMPLE 2

Figure 5:
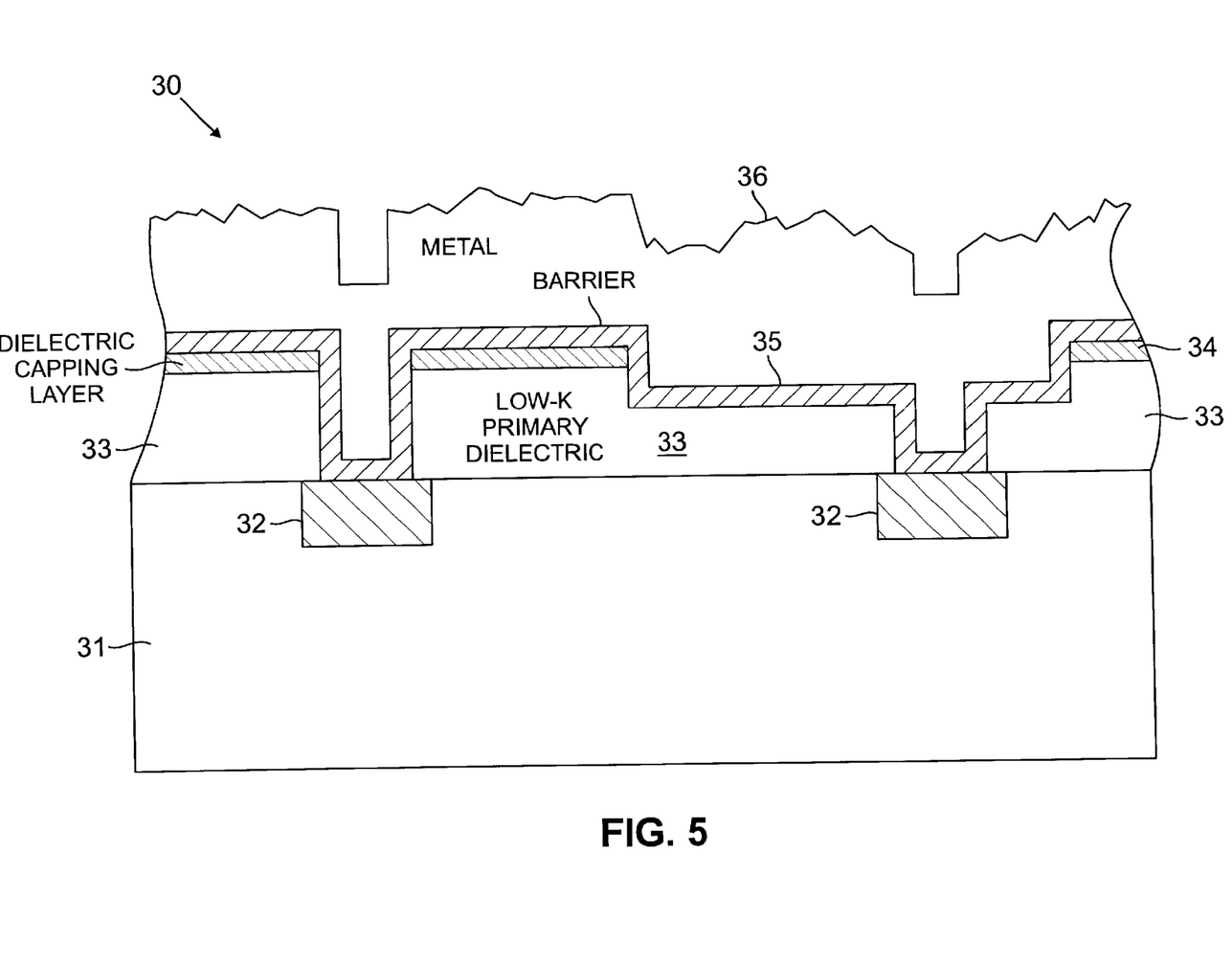
FIG. 5 is a schematic diagram of an exemplary bi-layer stack semiconductor wafer using low-k primary dielectric before commencement of the stage 1 polishing of the invention.

The invention is next described in an application to planarization of a stacked arrangement in a semiconductor wafer 30, the structure of which prior to commencement of polishing is shown in FIG. 5. Wafer 30 consists of a substrate layer 1 of dielectric material, which alternatively can be the silicon substrate of the wafer. Contact pads 32 are formed in layer 11. A layer 33 of low-k dielectric material (i.e., low dielectric constant typically in the range of 2.0 to 3.5) is formed as the primary dielectric on the upper surface of layer 31. Atop the upper surface of layer 33 there is formed a dielectric capping layer 34. At defined areas above capping layer 34 is formed a barrier layer 35. Metal layer 36 is formed on the upper surfaces of barrier layer 35. Initial topography of the top surface of layer 36 is indicated in FIG. 5.

Figure 6:
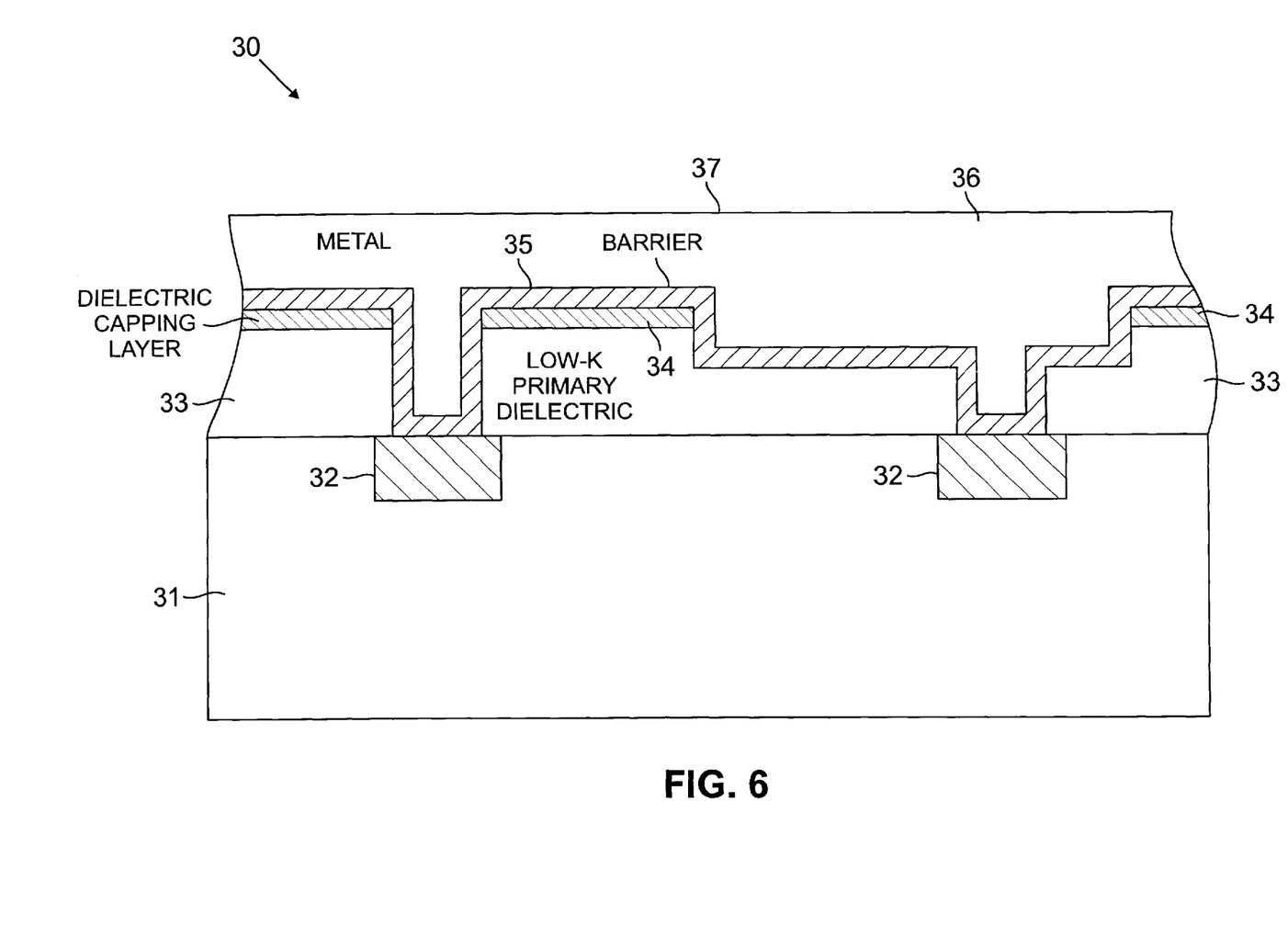
FIG. 6 is a schematic diagram of the wafer of FIG. 5 following application of stage 1 polishing.
Figure 7:
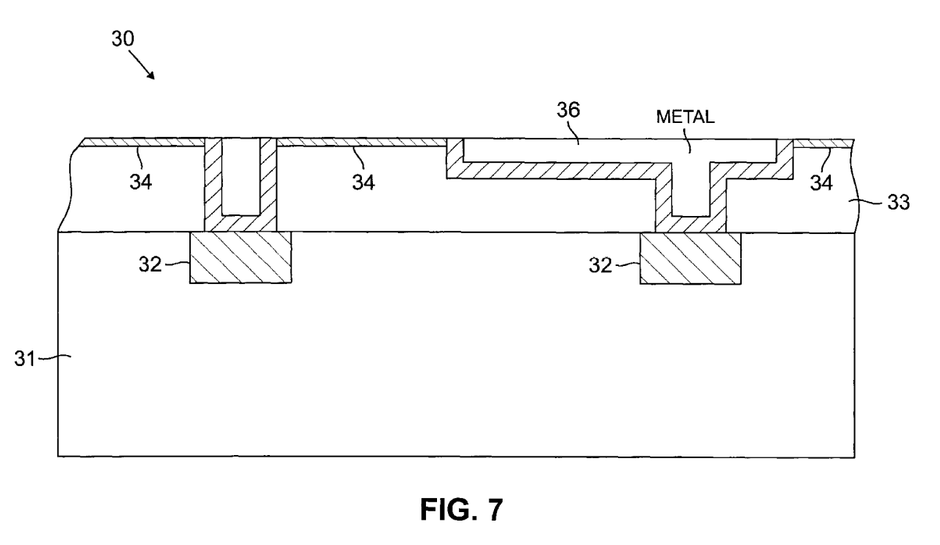
FIG. 7 is a schematic diagram of the wafer of FIG. 6 following application of stage 2 polishing.

Bulk metal removal is carried out in stage 1 using a slurry such as described for EX. 1. The end result is the geometry shown in FIG. 6 where 80–90% of the metal is removed and an ideally planar surface 37 is achieved. In stage 2, slurry is again employed having 1:1:1 removal rate ratios with regard to the metal, barrier and capping material. Stage 2 polishing proceeds with removal of horizontal aspects of barrier layer 35 and some amount of removal of capping layer 34, all at the same removal rate. Polishing stops short of contacting low-k dielectric layer 33. Slurry used in stage 2 may be the same as that described for EX. 1.

What is claimed is:

1. A process for CMP polishing of a surface of a Damascene semiconductor device to achieve both global and local planarization, said device comprising a silicon substrate, a primary low-k dielectric layer having a dielectric constant of substantially 3.5 or less disposed on top of said silicon substrate, a dielectric capping layer formed on top of said primary dielectric layer, a barrier layer formed on top of said dielectric capping layer and comprising upper horizontal segments, and a metallic top layer formed on the upper surfaces of said barrier layer, said metallic top layer having global and local topographic features on its upper surface, said process comprising the steps of:

using a first slurry, effecting a bulk CMP removal, at a rate of from 4,000 to 10,000 Angstroms per minute, of substantially 80% to 90% of said metallic top layer without penetrating to said barrier or dielectric capping layers, to form a first surface on said metallic top layer;

using a second slurry having substantially 1:1:1 removal rate ratios with regard to the materials comprising said metallic top layer, said barrier layer and said dielectric capping layer, in sequence effecting further CMP removal, at a rate of from 1,000 to 3,000 Angstrom units per minute, of said metallic top layer, removal of said upper horizontal segments of said barrier layer and removal of a minimal amount of said dielectric capping layer, and terminating CMP removal before contacting said primary low-k dielectric layer.

2. The process of claim 1, wherein said first slurry contains alumina in combination with one or more additives selected from the group consisting of oxidizers, surfactants, corrosion inhibitors, suspension agents and viscosity modifiers.

3. The process of claim 2, wherein said second slurry comprises a silica abrasive and an oxidizer.

4. The process of claim 3, wherein said bulk CMP removal step terminates at a preselected distance from said barrier layer.

5. The process of claim 4, wherein said metallic top layer is copper.

6. The process of claim 5, wherein said barrier layer is composed of material selected from the group consisting of tantalum, tantalum nitride, tantalum silicon nitride, titanium, titanium nitride, tungsten nitride, or tungsten silicon nitride.

7. The process of claim 6, wherein said primary dielectric layer is composed of material selected from the group consisting of TEOS, BPSG, PSG, and SOG.

8. The process of claim 6, wherein said primary dielectric layer is composed of material selected from the group consisting of polytetrafluoroethylene, benzocyclobutene, polyimide and polyaryl ether.

* * * * *